United States Patent [19]

Tawada et al.

[11] Patent Number: 4,664,890
[45] Date of Patent: May 12, 1987

[54] GLOW-DISCHARGE DECOMPOSITION APPARATUS

[75] Inventors: Yoshihisa Tawada; Takehisa Nakayama, both of Kobe; Masahiko Tai, Otsu; Nozomu Ikuchi, Nishinomiya, all of Japan

[73] Assignees: Kanegafuchi Kagaku Kogyo Kabushiki Kaisha, Osaka; Shimadzu Corporation, Kyoto, both of Japan

[21] Appl. No.: 746,693

[22] Filed: Jun. 20, 1985

[30] Foreign Application Priority Data

Jun. 22, 1984 [JP]  Japan ................. 59-129519
Jul. 2, 1984 [JP]  Japan ................. 59-137547

[51] Int. Cl.⁴ ............................................. B01J 19/08
[52] U.S. Cl. ........................ 422/186.05; 422/907; 422/186.29; 204/298; 118/715; 118/620
[58] Field of Search ........... 422/186.05, 186.06, 422/186.29, 907, 906, 186.04; 204/298; 118/715, 620

[56] References Cited

U.S. PATENT DOCUMENTS

| | | | |
|---|---|---|---|
| 3,471,396 | 10/1969 | Davidse | 422/186.05 X |
| 4,109,157 | 8/1978 | Tanaka et al. | 422/186.05 |
| 4,252,595 | 2/1981 | Yamamoto et al. | 422/186.05 X |
| 4,253,907 | 3/1981 | Parry et al. | 422/186.05 X |
| 4,264,393 | 4/1981 | Gorin et al. | 422/186.29 X |
| 4,292,153 | 9/1981 | Kudo et al. | 422/186.05 X |
| 4,353,777 | 10/1982 | Jacob | 204/298 X |
| 4,496,448 | 1/1985 | Tali et al. | 204/298 X |
| 4,557,819 | 12/1985 | Meacham et al. | 204/298 |
| 4,566,941 | 1/1986 | Yoshida et al. | 204/298 X |

OTHER PUBLICATIONS

Preparation of A-Si:H Films and Devices in the Interdigital Vertical Electrode Deposition Apparatus by H. Sakai et al, May 1981, pp. 76-78, Fuji Electric Corporate Research and Development Ltd.

Primary Examiner—John F. Terapane
Assistant Examiner—Susan Wolffe
Attorney, Agent, or Firm—Armstrong, Nikaido, Marmelstein & Kubovcik

[57] ABSTRACT

A glow-discharge decomposition apparatus comprises ground electrodes, substrates, RF-electrodes, a RF-power supply, a matching circuit and a controlling circuit having at least one electric element. Each of the substrates is provided on the ground electrodes which are placed over each of the RF-electrodes in parallel to each other. Each of the RF-electrodes standing in parallel are electrically insulated to each other. The matching circuit is connected to accept a RF-power from the RF-power supply. The controlling circuit is connected to accept a RF-power from the matching circuit. The outputs of the controlling circuit are connected to supply RF-powers to the RF-electrodes. The films are fabricated on the substrates by supplying RF-powers being independently controlled via the controlling circuit, thereby plasmas are controlled over each of the RF-electrodes. Thus, deposition rates are individually controlled and uniform films are fabricated on each of the substrates.

15 Claims, 12 Drawing Figures

GLOW-DISCHARGE DECOMPOSITION APPARATUS

BACKGROUND OF THE INVENTION

The present invention relates to a glow-discharge decomposition apparatus, and the preparation of a semiconductor film employed in the glow-discharge decomposition apparatus.

In a conventional glow-discharge decomposition apparatus, a substrate 4 shown in FIG. 1 is horizontally provided on a ground electrode labelled 3, wherein a RF-electrode 1, heater 5, and the like are arranged in a way as illustrated in FIG. 1. The numeral 10 is a port from which the gases enter into the chamber. The numeral 11 is another port through which gases are evacuated by an evacuator. In such an apparatus, a semiconductor film can be widely deposited on a substrate, but an excess discharge takes place at a rear side of the RF-electrode. To avoid the discharge at the rear side, a shield 7 must be prepared as in FIG. 1, but such a shielding results in an unstability of a glow-discharge.

An apparatus shown in FIG. 2 is arranged for two-side deposition and is free from the shielding. In the apparatus, substrates 41 and 42 are vertically provided on ground electrodes 31 and 32, and a RF-electrode labelled 1 stands at the center of the ground electrodes. A glow-discharge takes place over both sides of the RF-electrode 1. If necessary, substrates 41 and 42 are heated by heaters 51 and 52. In such an apparatus, only one RF-electrode 1, one RF-power supply 9 and one matching circuit 8 can be prepared, although two substrates are placed. However, the apparatus represents a certain handicap wherein the deposition rate on the substrate cannot be independently controlled when the required deposition rates on both sides are very different from each other.

To control the individual power to the RF-electrodes, an apparatus can be designed in which two substrates stand in the center of a chamber, two RF-electrodes 11 and 12 face the two substrates, respectively, and two independent RF-power supplies 91 and 92 and matching circuits 81 and 82 are provided as in FIG. 3. Individual control of the discharge is realized by adjusting every electric output power, to control the deposition rates. However, there might be an interference between RF-power supplies which supply RF-powers to each electrode. Furthermore, two RF-power supplies and two matching circuits are needed, so that the apparatus as disclosed above, due to its complexity, costs too much and establishes some limitations.

An object of the present invention is to provide a glow-discharge decomposition apparatus which gives different or same depositing rate on each substrate by an individual control of RF-powers supplied to each electrode with one RF-power supply and one matching circuit.

SUMMARY OF THE INVENTION

The above problem is solved by providing a glow-discharge decomposition apparatus which comprises a RF-power supply, matching circuit and controlling circuit having at least one electric element. The matching circuit is connected to accept a RF-power from the RF-power supply, and the controlling circuit is connected to accept RF-powers from the matching circuit. The outputs of the controlling circuit are connected to supply RF-powers to the RF-electrodes.

Films can be deposited at a different or same rate on each substrate in the glow-discharge decomposition apparatus by controlling plasmas over each RF-electrode. The control is carried out by adjusting the controlling circuit which supplies RF-powers to each of the RF-electrodes.

The glow-discharge decomposition apparatus of the present invention makes it possible to deposit films on each substrate at a different or same rate by means of one RF-power supply, one matching circuit and one controlling circuit.

DETAILED DESCRIPTION

Figure 1:
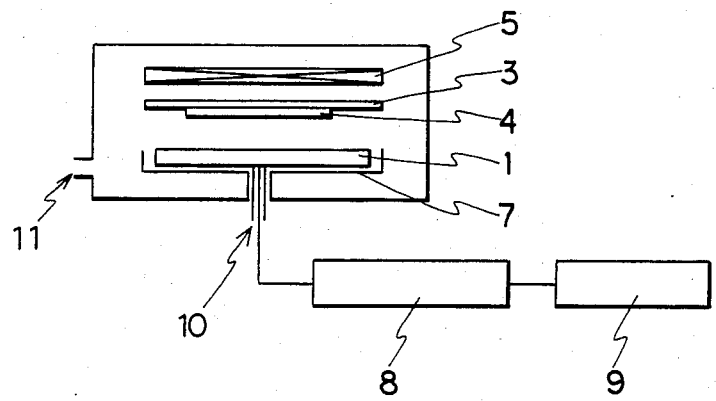
FIG. 1 is a diagram of a horizontally arranged glow-discharge decomposition apparatus arranged for one-side deposition.
Figure 2:
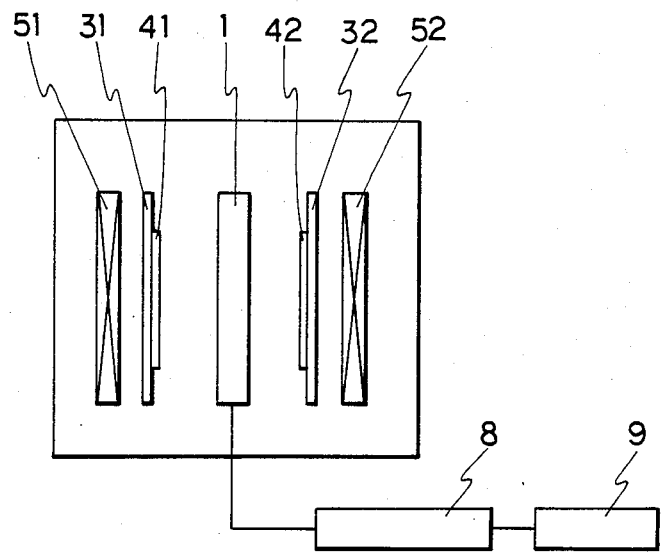
FIG. 2 is a diagram of a conventional two-substrate type glow-discharge decomposition apparatus arranged for two-side deposition.
Figure 3:
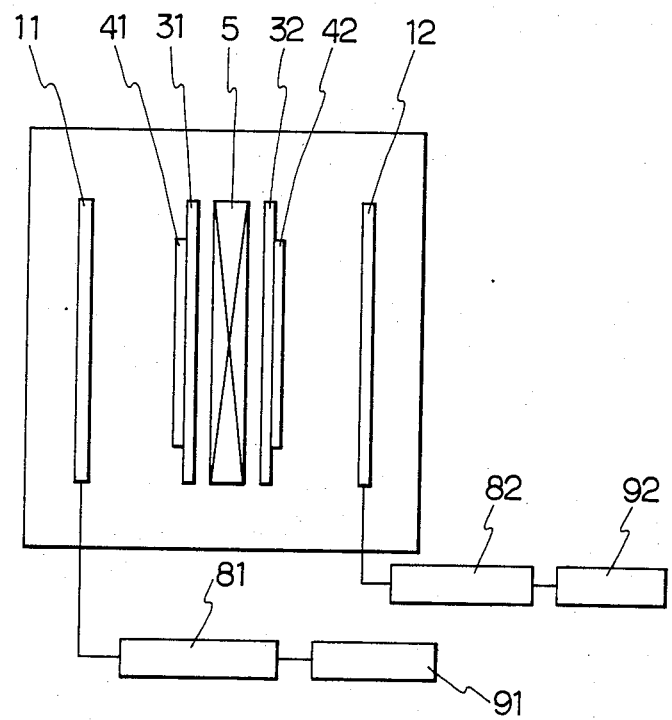
FIG. 3 is a diagram of a glow-discharge decomposition apparatus including two independent RF-systems.
Figure 4:
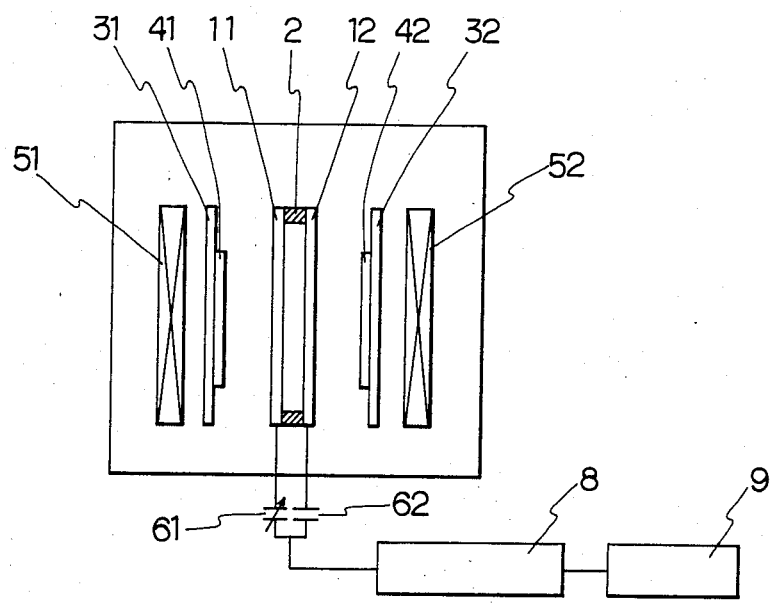
FIG. 4 is a digram of an embodiment of a glow-discharge decomposition apparatus in the present invention.
Figure 5:
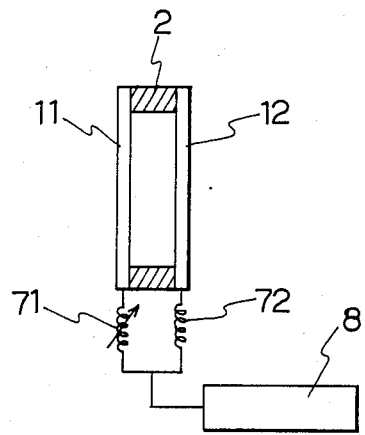
FIGS. 5, 6, 7 and 8 are diagrams, respectively illustrating a controlling circuit.
Figure 6:
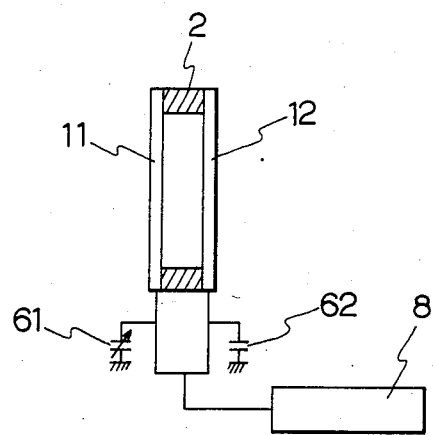
Figure 7:
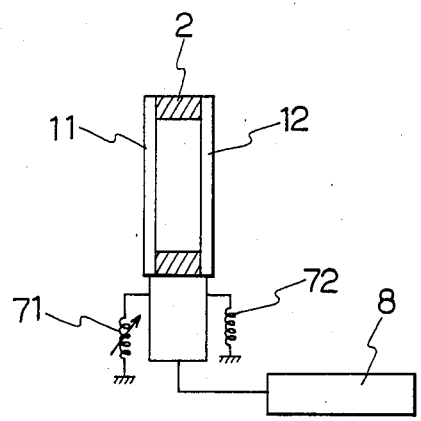
Figure 8:
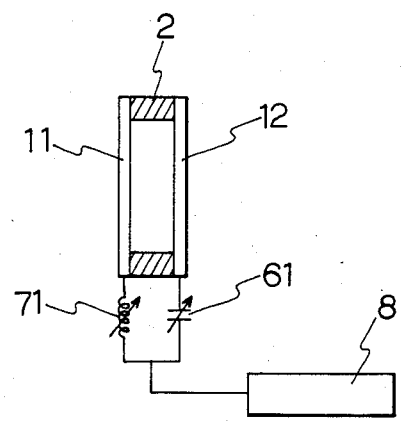

The apparatus of the present invention is explained referring to the diagram of FIG. 4, wherein RF-electrodes labelled 11 and 12 are standing in parallel and insulated from each other by an insulator 2. A controlling circuit having a variable capacitor 61 and a fixed capacitor 62 is connected to the RF-electrodes 11 and 12 outside a reacting chamber. A RF-power is generated by a RF-power supply 9 and divided into two through a matching circuit 8, thereby, the divided RF-powers are supplied to the RF-electrodes 11 and 12, respectively. Over the RF-electrodes 11 and 12, ground electrodes 31 and 32 are placed in parallel to the RF-electrodes. Substrates 41 and 42 are provided on the ground electrodes 31 and 32, respectively. Heaters labelled 51 and 52 can be used to heat the substrates 41 and 42. With respect to the RF-electrodes 11 and 12, the insulator 2 can be replaced by another member as long as it fixes and insulates the RF-electrodes.

In the embodiment as described in FIG. 4, the rate of deposition is individually controlled by adjusting the capacitors which are respectively connected to the RF-electrodes.

Examples of a method of adjusting the capacitor are a method of checking the thickness of the film after a testing deposition, a method of detecting the strength of the glow-discharge by eye, a method of detecting the strength of the glow-discharge by OES (Optical Emission Spectroscopy), and the like. In the last case, the adjustment is carried out by a manual operation or an automatic operation. The automatic operation is carried out by an automatic-mechanism combined with a detector and a servo-motor. The adjustment using the automatic-mechanism is the most preferable of those methods.

The controlling circuit includes electric elements, such as the series capacitors in FIG. 4, a couple of capacitors or inductors which are connected in series to the RF-electrodes or in parallel to the ground. The explanatory diagrams of those connections are illustrated in FIGS. 5, 6, 7 and 8. Another combination of the electric elements can be designed. For instance, only one element is connected to one of the RF-electrodes, and the other RF-electrode is directly connected to a branch of the matching circuit.

In conclusion, the controlling circuit having electric elements is capable of being adjusted to control a RF-power derived from the matching circuit and to supply the RF-power to the RF-electrodes.

Figure 9:
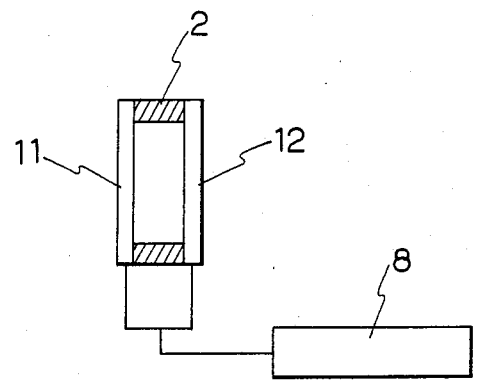
FIG. 9 is a diagram of electric elements of RF-conducting plates.

The inductor in the invention is, for example, a spiral coil, or a RF-conducting plate having inductance due to its prescribed shape. FIG. 9 shows the latter case, wherein the inductor is a couple of RF-conducting copper plates. The inductance can be varied to some extent depending upon the shape or length of the plate.

Figure 10:
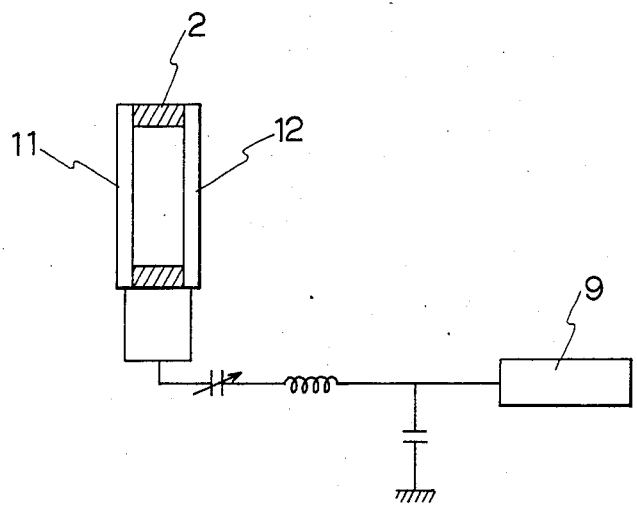
FIG. 10 is a diagram illustrating a matching circuit.

When the adjustment of the capacitance or inductance is carried out to vary or equalize the strength of the plasma, electrical parameters of the whole circuit are also changed. Thus the matching circuit must be tuned again under the RF-power condition in use. The matching circuit includes a variable capacitor in most cases. FIG. 10 shows an illustrative diagram of a typical matching circuit.

In spite of the explanation of the disclosure, "a matching circuit" can be also defined to mean a circuit including both the controlling circuit and the matching circuit as described above.

The distance between the RF-electrodes 11 and 12 which are insulated at the insulator 2 is optionally determined, for example, 1 to 200 mm under ordinary conditions. The distance between the RF-electrode and the substrate is preferably 5 to 50 mm and more preferably 10 to 30 mm for stability and uniformity of the plasma.

Figure 11:
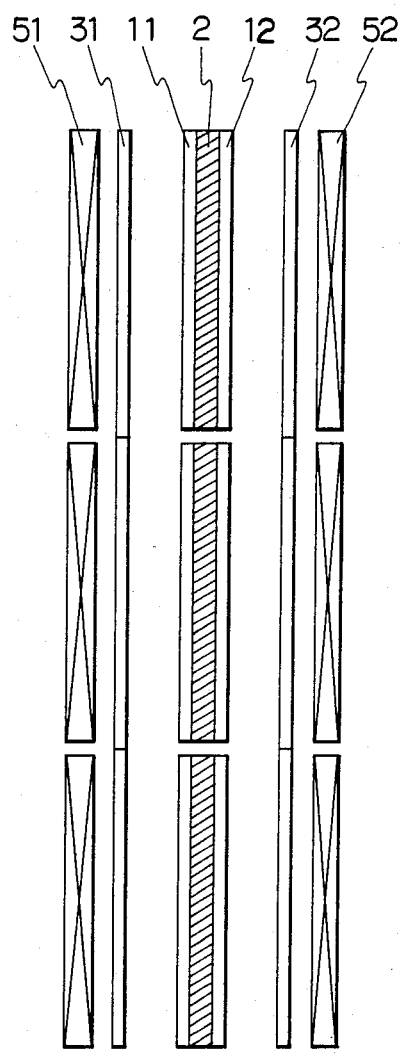
FIGS. 11 and 12 are explanatory drawings as to an arrangement of an apparatus having plural sets of RF-electrodes, substrates and heaters.
Figure 12:
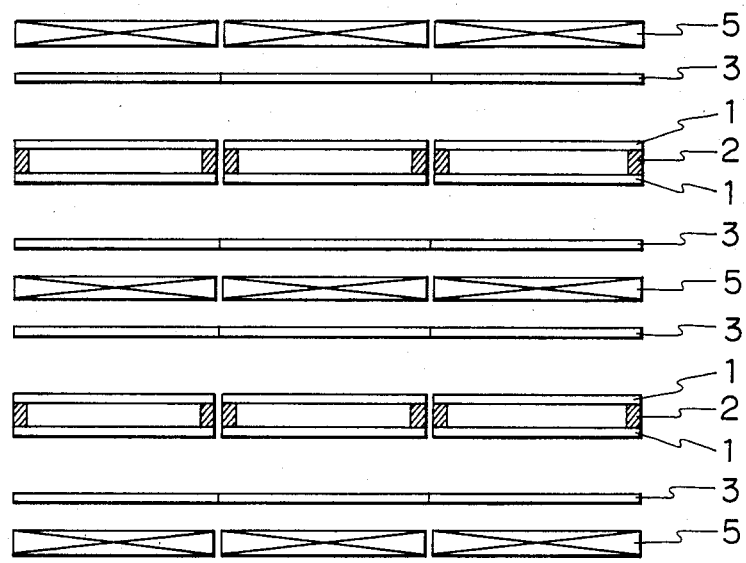

The area of the RF-electrode is preferably not more than 1 m$^2$, and when a wider area is required, a plurality of RF-electrodes, each of which is limited within 1 m$^2$, can be used. The arrangement of such RF-electrodes is shown in FIG. 11. Such an arrangement allows a deposition onto a wide area, wherein each of the RF-electrode is electrically connected in series. As pointed out in the foregoing, the area of each RF-electrode is limited within 1 m$^2$ in the parallel-plate electrodes arranged as shown in FIGS. 1 to 12.

The apparatus can have a substrate carrying means that transfers substrates before, during or after the deposition. The substrate can be carried in one direction or move right and left keeping a distance from the RF-electrode. It is a matter of course that the substrates face parallel to the RF-electrodes during the movement. Also, the substrates can be moved in one direction keeping a distance too the RF-electrodes. An example of the embodiment is a multi-chambered depositing apparatus, wherein the substrate in a chamber is transferred to another chamber. The movement in one direction is preferable when a film is successively deposited on a long continuous substrate which is moving from one chamber to another.

An uniformity of the thickness of the film can be preferably obtained by shifting the substrate right and left as mentioned above. The RF-electrodes and substrates can be vertically, horizontally or obliquely arranged as long as they are set in parallel to each other. However, a vertical arrangement permits a deposition of an excellent film since the vertical arrangement prevents dusts from falling on the substrates.

If necessary, the substrate can be heated by a heater. A temperature of the substrate is selected depending on the composition of film or the using purpose for deposited film. In an ordinary condition, the temperature is preferably employed in a range of 50° to 400° C.

The apparatus in the invention consists of RF-electrodes, substrates and heaters as described above. In such an apparatus, a RF-electrode, substrate and heater make up a fundamental set for deposition. The apparatus may have a plurality of those sets as in FIG. 12. The number of those sets can be 1 to 100, preferably 1 to 10 in the invention.

In an apparatus for depositing a film by a glow-discharge plasma, any type of apparatus can be utilized. However, when a multi-chambered apparatus is used, a film can be prepared by the process of the present invention in each of the chambers, wherein p, i and n-layers of the semiconductor are successively deposited. In the embodiment, the multi-chambered apparatus has slits or gate valves on walls for dividing chambers so as to enter the substrates into the neighboring chamber. Gas in the chamber can be exhausted by a differential evacuator. The differential evacuator is a means to successively evacuate gas in each chamber when a substrate in a chamber moves into the next chamber. When a differential evacuator is provided in the multi-chambered apparatus, the substrates can be continuously transferred from chamber to chamber without opening or shutting the gate valves. Such a function in the multi-chambered apparatus yields an increase of producibility.

The process for preparation of amorphous-semiconductor films by the apparatus of the invention is as follows: A glow-discharge takes place in an atmosphere of gases containing silicide, carbonate, nitride, dopant gases and inert gases under 0.01 to 5 Torr, at a RF-frequency of 1 to 100 MHz, and under a RF-power density for deposited area of 0.003 to 0.2 W/cm$^2$ (The RF-power is 0.1 to 5 W/cm$^2$ when microcrystalline film is desired), and a film of 0.005 to 100 $\mu$m is deposited on the substrate.

In such a process of the invention, an uniform and homogeneous deposition over a wide area of substrate can be performed. Moreover, due to the stability of the glow-discharge plasma in the apparatus, an excess discharge is avoided, so that the RF-power can be efficiently utilized.

In the arrangement of the invention, the use of RF-power is fully improved. A film of an electric device such as p-i-n diode, p-n diode, solar cells having heterojunction or homojunction, sensor, TFT (Thin Film Transistor) and CCD (Charge Coupled Device) can be prepared according to the arrangement of the invention. And a sensitized film for electrophotography, LSI passivation film, insulating film for printed-circuit, or the like, is also preferably provided. Especially, due to the stability of the plasma in the apparatus, an amorphous silicon solar cell having a high efficiency of more than 10% can be prepared over a wide area by the process of the invention.

Examples according to the present invention are described in the followings.

It is to be understood that the present invention is not limited the Examples, and various changes and modifications may be made in the invention without departing from the spirit and scope thereof.

EXAMPLE 1

A film was prepared by the glow-discharge decomposition apparatus shown in FIG. 4.

The RF-electrodes (500 mm × 560 mm) were insulated by an insulator of 4 mm thick. The RF-power was supplied to the capacitors via the matching circuit. The RF-frequency was 13.56 MHz and the capacitances were 250 pF in the fixed capacitor and 500 pF (maximum) in the variable capacitor. A p-i-n semiconductor film was prepared on a transparent ITO/SnO$_2$-glass substrate of 40 cm$^2$. The temperature of the substrate was about 200° C.

First, a p-layer was deposited in 100 Å under a mixed gas of SiH$_4$ (50% by mole) and CH$_4$ (50% by mole) including 0.05% by mole of B$_2$H$_6$. Next, an i-layer was deposited in 6000 Å, and at last a n-layer was deposited in 500 Å under the mixed gas including 0.2% by mole of PH$_3$. The capacitances of the fixed and variable capacitores were 250 pF and 350 pF, respectively.

Thereon, a layer of aluminum in 1000 Å thick was deposited as a backing electrode by electron-beam-evaporation. The conversion efficiencies of the solar cells prepared by the above-described manner were respectively measured by means of a AM-1 solar simulator of 100 mW/cm$^2$. The efficiencies were distributed at the average of 11%, the maximum of 11.7% and the minimum of 10.4%. The deposition rate was 10 Å per second. The thicknesses of the obtained films on the two substrates were identical.

EXAMPLE 2

Films were prepared by the same manner as in Example 1, but the capacitance of the variable capacitor was varied from 10 to 500 pF. The deposition rates of the obtained films prepared on the both substrates are shown in Table 1.

TABLE 1

| | Deposition Rate (Å/sec) | |
|---|---|---|
| Capacitance of the Variable Capacitor (pF) | Deposition on the substrate faced to the RF-electrode being connected to the fixed capacitor | Deposition on the substrate faced to the RF-electrode being connected to the variable capacitor |
| 10 | 4.6 | 1.5 |
| 100 | 3.7 | 2.6 |
| 350 | 3.1 | 3.15 |
| 500 | 2.2 | 4.0 |

What we claim is:

1. An apparatus for depositing a film on a substrate by glow-discharge decomposition, the apparatus comprising:
    two ground electrodes, two sets of substrates, two RF-electrode portions forming one RF-electrode, a RF-power circuit supply, a matching circuit and a controlling circuit having at least one electric element;
    each of said substrates being provided on said ground electrods which are placed over each of the RF-electrode portions, in such a way that two sets of substrates are placed on both sides of said RF-electrode which is electrically divided into said two RF-electrode portions by being insulated from each other, said two RF-electrode portions standing in parallel to each other; said matching circuit being connected to accept a RF-power from the RF-power supply;
    said controlling circuit being connected to accept a RF-power from said matching circuit; and
    the outputs of the controlling circuit being connected to supply RF-powers to the RF-electrode to control the deposit rate on each substrate.

2. The apparatus of claim 1, wherein the controlling circuit has fixed capacitor and variable capacitor.

3. The apparatus of claim 1, wherein the controlling circuit has fixed inductor and variable inductor.

4. The apparatus of claim 1, wherein said RF-electrode portions forming one RF-electrode and two ground electrodes form a set and wherein 1 to 100 sets are provided.

5. The apparatus of claim 1, wherein the substrates are carried by a substrate carrying means which transfers substrates keeping a distance parallel to the RF-electrode.

6. The apparatus of claim 1, wherein a frequency of RF-power is 1 to 100 MHz.

7. The apparatus of claim 1, wherein a heater for heating the substrate is provided.

8. The apparatus of claim 2, wherein the capacitors are connected in series to the RF-electrode.

9. The apparatus of claim 2, wherein the capacitors are connected in parallel to the ground.

10. The apparatus of claim 3, wherein the inductors are connected in series to the RF-electrode.

11. The apparatus of claim 3, wherein the inductors are connected in parallel to the ground.

12. The apparatus of claim 5, wherein the substrates move right and left keeping a distance parallel to the RF-electrode.

13. The apparatus of claim 5, wherein the substrates move in one direction keeping a distance parallel to the RF-electrode.

14. An apparatus for depositing a film on a substrate by glow-discharge decomposition, said apparatus comprising:
    RF-electrode, wherein said RF-electrode is divided into two RF-electrode portions, each of said RF-electrode portions being insulated from one another, said two RF-electrode portions being arranged parallel to one another;
    two ground electrodes, each of said ground electrodes arranged opposite and parallel to each RF-electrode portion of said RF-electrode, wherein said two grounded electrodes and said RF-electrode form a set;
    two sets of substrates, each of said substrates being provided on each of said ground electrodes facing one of said RF-electrode portions;
    RF-power supply;
    matching circuit connected to accept RF-power from said RF-power supply; and controlling circuit having at least one electric element, said controlling circuit being connected to accept RF-power from said matching circuit wherein the outputs of said controlling circuit are connected to supply RF-power to said RF-electrode.

15. An apparatus according to claim 14, wherein the rate of deposit is controlled by adjusting said controlling circuit which is connected to said RF-electrode portions respectively.

* * * * *